United States Patent
Galal et al.

[19]

[11] Patent Number: 6,161,004

[45] Date of Patent: Dec. 12, 2000

[54] METHOD AND APPARATUS FOR REJECTING IMAGE SIGNALS IN A RECEIVER

[75] Inventors: Sherif H. Galal; Mohamed S. Tawfik, both of Cairo, Egypt

[73] Assignee: Mentor Graphics Corporation, Wilsonville, Oreg.

[21] Appl. No.: 09/226,337

[22] Filed: Jan. 6, 1999

Related U.S. Application Data

[63] Continuation-in-part of application No. 09/033,508, Mar. 2, 1998.

[51] Int. Cl.[7] .................................................. H04B 1/10
[52] U.S. Cl. ......................... 455/302; 455/303; 455/306; 455/315
[58] Field of Search .................................... 455/302, 303, 455/305, 306, 316, 315, 314

[56] References Cited

U.S. PATENT DOCUMENTS

| | | |
|---|---|---|
| 5,020,147 | 5/1991 | Okanobu . |
| 5,113,428 | 5/1992 | Fitzgerald . |
| 5,140,198 | 8/1992 | Atherly et al. . |
| 5,179,726 | 1/1993 | Moon ................................... 455/188.4 |
| 5,564,098 | 10/1996 | Rodal et al. ............................. 455/314 |
| 5,710,997 | 1/1998 | Okanobu ................................. 455/316 |
| 5,752,175 | 5/1998 | Roullet et al. ........................ 455/183.1 |
| 5,802,463 | 9/1998 | Zuckerman ............................. 455/208 |
| 5,950,119 | 9/1999 | McGeehan et al. ..................... 455/302 |
| 5,953,640 | 9/1999 | Meador et al. ............................ 455/73 |
| 5,963,724 | 10/1999 | Mantooth et al. . |
| 5,971,595 | 10/1999 | Grant et al. . |
| 5,974,241 | 10/1999 | Fusco . |

FOREIGN PATENT DOCUMENTS

| | | | |
|---|---|---|---|
| 2242588 | 10/1990 | United Kingdom ............. H04B 1/30 |
| 2242588 | 10/1991 | United Kingdom ............. H04B 1/30 |

OTHER PUBLICATIONS

Asad A. Abidi, "Direct–Conversion Radio Transceivers for Digital Communications," IEEE Journal of Solid–State Circuits, vol.30, No. 12, Dec. 1995, pp. 1399–1410.

Jan Crols and Michael S. J. Steyaert, "A Single–Chip 900 MHz CMOS Receiver Front–End with a High Performance Low–IF Topology," IEEE Journal of Solid–State Circuits, vol.30, No. 12, Dec. 1995, pp. 1483–1492.

Rudell et al., "A 1.9–GHz Wide–Band IF Double Conversion CMOS Receiver for Cordless Telephone Applications," IEEE Journal of Solid–State Circuits, vol. 32, No. 12, Dec. 1997, pp. 2071–2088.

Jantzi et al., "Quadrature Bandpass ΔΣ Modulation for Digital Radio, " IEEE Journal of Solid–State Circuits, vol.32, No. 12, Dec. 1997, pp. 1935–1950.

*Primary Examiner*—Edward F. Urban
*Assistant Examiner*—Blane J. Jackson
*Attorney, Agent, or Firm*—Blakely Sokoloff Taylor & Zafman, LLP

[57] ABSTRACT

In one embodiment, an apparatus comprising a mixing network coupled to a summing stage is presented. The mixing network is operative to receive a signal and process the received signal along a first branch of the mixing network to produce a first mixed signal containing an image signal, and along a second branch of the mixing network to produce a second mixed signal containing the image signal and a desired signal. The summing stage, coupled to the first and second branch of the mixing network, is operative to subtract the first mixed signal from the second mixed signal to produce a downconverted signal comprising the desired signal while rejecting the image signal.

24 Claims, 9 Drawing Sheets

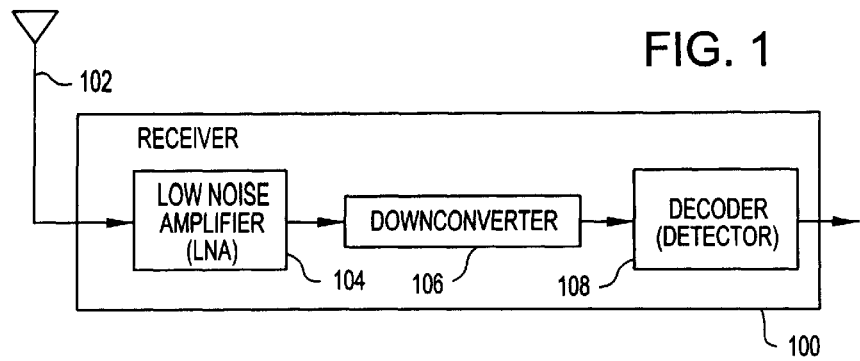
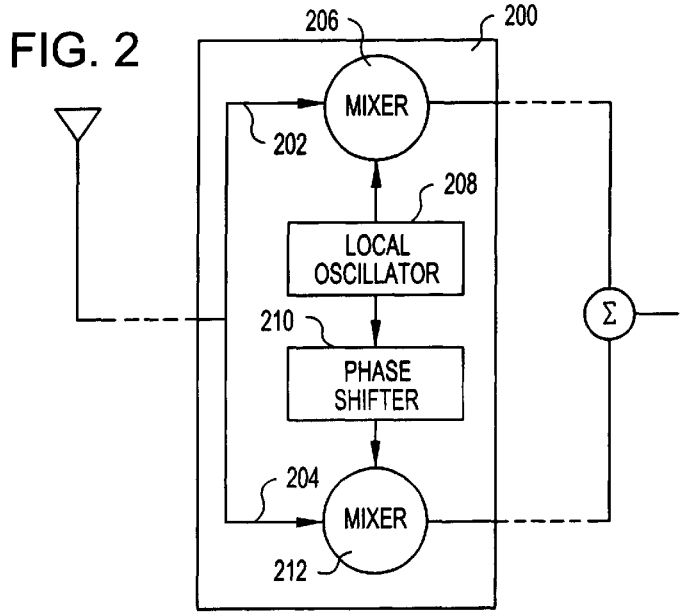
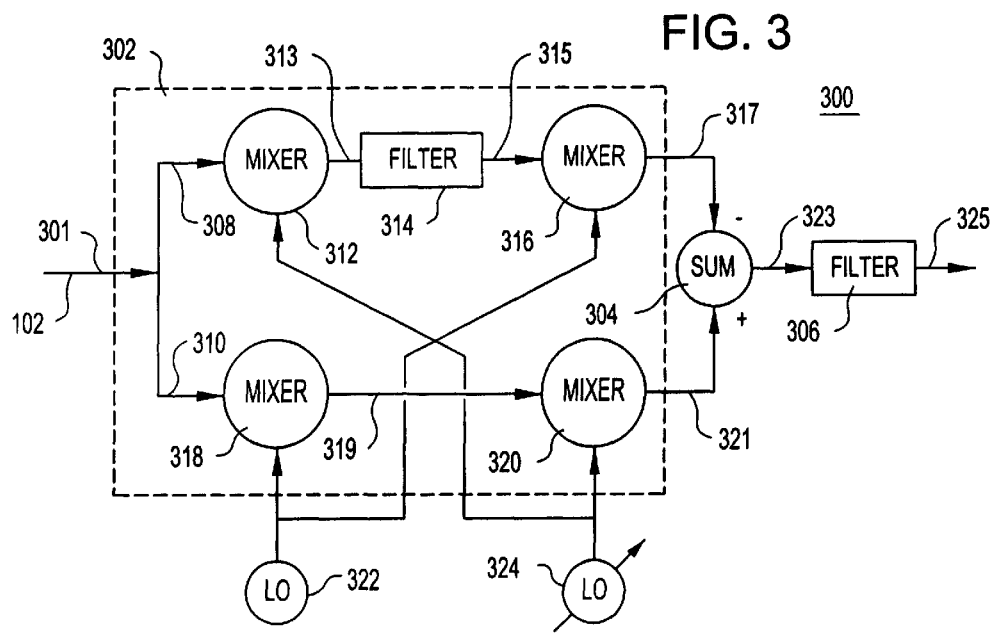

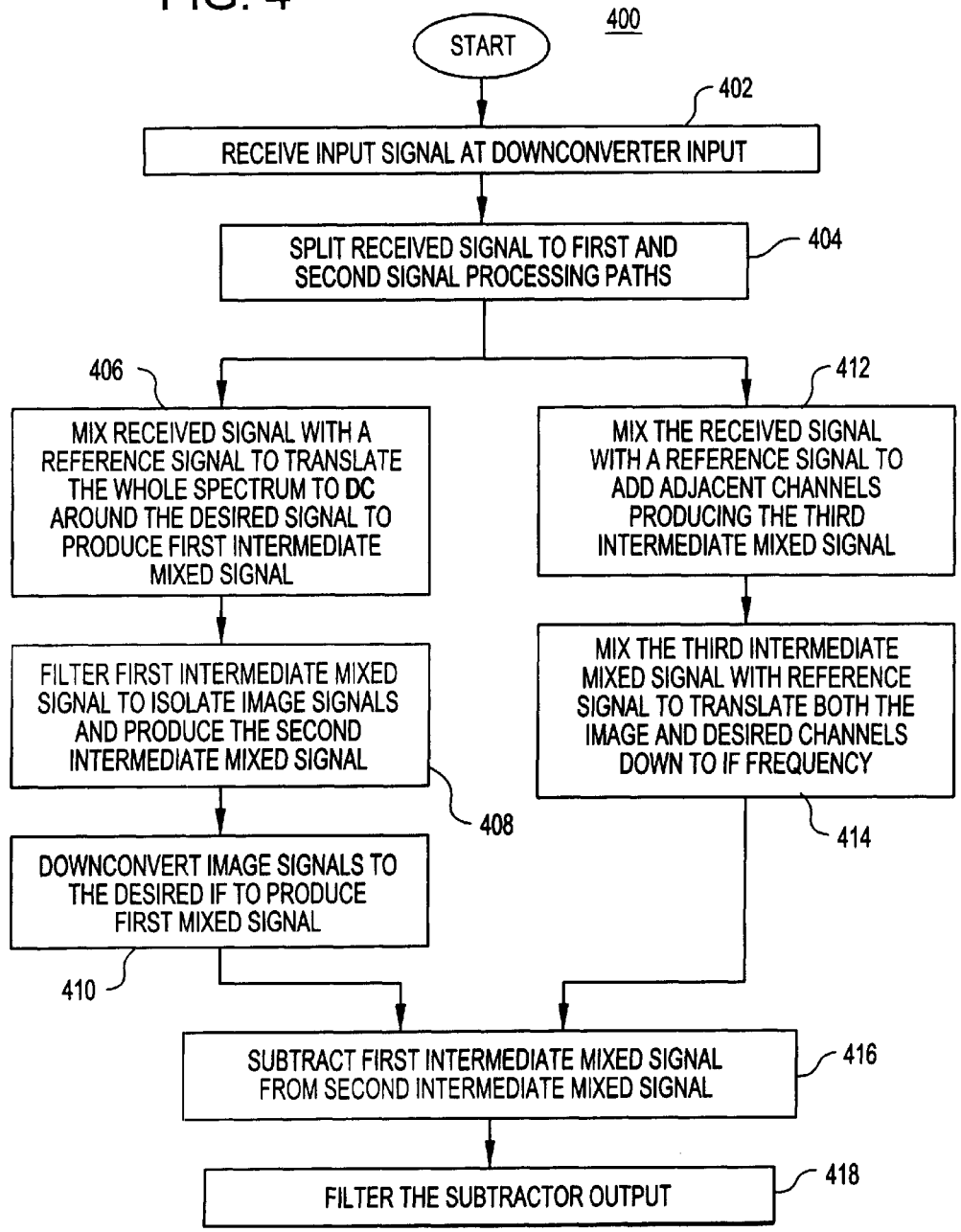

METHOD AND APPARATUS FOR REJECTING IMAGE SIGNALS IN A RECEIVER

RELATED APPLICATIONS

The present invention is a continuation-in-part of copending U.S. application Ser. No. 09/033,508 entitled Method and Apparatus for Rejecting Image Signals in a Receiver, filed Mar. 2, 1998 by the Applicants of the present application, and commonly assigned to the assignee of the present application.

BACKGROUND OF THE INVENTION

1. Field of the Invention

The present invention relates to the field of communication systems in general and, in particular, to a method and apparatus for rejecting image signals in a receiver.

2. Background Information

The wireless communications industry has been swept up in a technological revolution over the past two decades. Commercial wireless systems have evolved from simple one-way (paging) communication systems to two-way communication systems comprising analog cellular systems and, more recently, digital cellular systems. During this technological revolution, the size and weight of the wireless communication handset has been dramatically reduced. Today, handsets that fit comfortably in the palm of one's hand and weighing less than seven ounces are commonplace. This dramatic reduction in size and weight has been facilitated by large scale integration of the many discrete components that historically comprised the electronics of the transceiver (e.g., transmitter and receiver), reducing the number of electronic components required to just a few. Thus, it is not surprising that the next logical step in this technological revolution is an integrated single-chip transceiver.

Those skilled in the art may well recognize that technical impediments remain before an integrated single-chip transceiver can be produced, reliably, in large quantities. In particular, integration of the discrete components comprising the receiver presents one of the greatest challenges. To understand these challenges, a brief review of a simple receiver is provided with reference to the block diagram of FIG. 1.

As depicted in FIG. 1, receiver 100 receives a carrier signal via input 102, in this case, coupled to an antenna. The received signal is passed through a low-noise amplifier 104, wherein the signal is filtered and amplified to further distinguish the desired signal from the noise floor. Downconverter 106 downconverts the received signal to an intermediate frequency (IF) signal, whereupon decoder (detector) 108 recovers the baseband signal containing the desired information from the IF signal. One example of a prior art downconverter employs one (heterodyne) or more (superheterodyne) mixers, which mix the received signal with a reference signal generated by a local oscillator. The resulting mixing of these two signals produce a "sum" and a "difference" of the two signals, wherein the sum component of the resultant is easily filtered out. However, (super) heterodyne downconversion employing mixers renders a receiver sensitive to an undesirable signal at 2× the IF from the desired carrier frequency, commonly referred to as the image signal. For example, suppose a receiver is tuned to 160 MHz, with an IF of 29.5 MHz, the receiver will thus be susceptible to image signals at a frequency of 160−(2× 29.5)=101 MHz, a common FM-radio broadcast frequency. Thus, even though the receiver is "tuned" to receive and demodulate a signal at 160 MHz (e.g., the carrier signal), left unchecked, the downconverter will introduce an undesirable (image) signal at 101 MHz. Thus, one can see how the heterodyne downconversion process can subject the receiver to a number of image signals. Consequently, a high precision, high frequency filter (image-reject filter) is often employed prior to the mixing process to reduce the receiver's susceptibility to image signals. Similarly, a highly selective IF filter is required for the selection of the desired signal after downconversion. This filter is also difficult to implement using integrated filter technologies especially if the IF is relatively high.

Those skilled in the art of integrated circuit (IC) manufacturing will appreciate that while fabrication of low frequency passband filters within an IC is possible, the fabrication of a complex high frequency passband filter is extremely difficult on a large scale due to nominal process variations. Consequently, the prior art heterodyne downconversion technique does not lend itself to receiver integration.

Another category of prior art downconverters known as "image-reject mixers" involve the decomposition of the received signal into its in-phase and quadrature components, commonly referred to as quadrature downconversion. One example of a prior art quadrature downconverter is depicted in FIG. 2. As illustrated in FIG. 2, quadrature downconverter 200 splits the received signal down two parallel paths 202 and 204, respectively. In path 202, the received signal is mixed with a reference signal from a local oscillator (LO) 208 at mixer 206 to produce the in-phase (I), or real component. Along path 204, the received signal is mixed with the reference at mixer 212, wherein the reference signal from LO 208 is phase shifted by ninety degrees at phase shifter 210, producing the quadrature (Q), or imaginary component of the received signal. The in-phase component (I) and the quadrature component (Q) are then combined in a way to produce constructive interference on the signal of interest and destructive interference on the unwanted image signal.

Although quadrature downconversion can improve the image rejection of a receiver, the in-phase and quadrature signal processing paths of a quadrature downconverter must be very-well matched in terms of gain and phase over the frequency range of the local oscillator. Gain and/or phase imbalance will result in incomplete image signal suppression, and renders the receiver sensitive to unwanted image signals. Currently, practical mismatch in current IC manufacturing technologies is in the order of three-degrees (3°), while gain mismatch is on the order of one to five percent (1–5%) which limits the image rejection of the receiver to no more than 30 dB. Consequently, quadrature image-reject mixers do not lend themselves well to current integrated technologies unless gain and phase compensation techniques are employed.

More recently, research on alternative downconversion techniques has focused on direct-conversion or zero-IF downconverter architectures. While disparate aspects of this architecture lend themselves well to integration technology by eliminating the need for selective RF and IF filters, they still suffer from many of the gain/phase matching problem discussed earlier, in addition to other problems arising from the fact that the desired signal is translated directly to DC, where offset and noise components may add to the desired signal. Consequently, none of the foregoing downconverter architectures are readily integrable into a large scale highly integrated single-chip transceiver.

Thus, a method and apparatus for rejecting image signals in a receiver is required that overcomes the inherent limitations and deficiencies commonly associated with the prior art. Just such a method and apparatus is presented in accordance with the teachings of the present invention that achieves these and other desired results.

SUMMARY OF THE INVENTION

In accordance with the teachings of the present invention, a method and apparatus for rejecting image signals in a receiver is presented. In particular, in accordance with a first embodiment of the present invention, an apparatus comprising a mixing network coupled to a summing stage is presented. The mixing network is operative to receive a signal and process the received signal along a first branch of the mixing network to produce a first mixed signal containing an image signal, and along a second branch of the mixing network to produce a second mixed signal containing the image signal and the desired signal. The summing stage, coupled to the first and second branch of the mixing network, is operative to subtract the first mixed signal from the second mixed signal to produce a downconverted signal comprising the desired signal but devoid of the image signal.

BRIEF DESCRIPTION OF DRAWINGS

The present invention will be described by way of illustration, but not limitations, in accordance with the accompanying figures in which like references denote similar elements, and in which:

FIG. 1 illustrates a block diagram of an example receiver within which the teachings of the present invention may be practiced, in accordance with one embodiment of the present invention;

FIG. 2 illustrates a block diagram of an example of a prior art quadrature downconverter;

FIG. 3 illustrates a block diagram of an example downconverter in accordance with the teachings of the present invention, in accordance with one embodiment of the present invention;

FIG. 4 illustrates a flow chart of an example method for downconverting a received signal using spectrum manipulation, in accordance with one embodiment of the present invention;

DETAILED DESCRIPTION OF THE INVENTION

Figure 5:
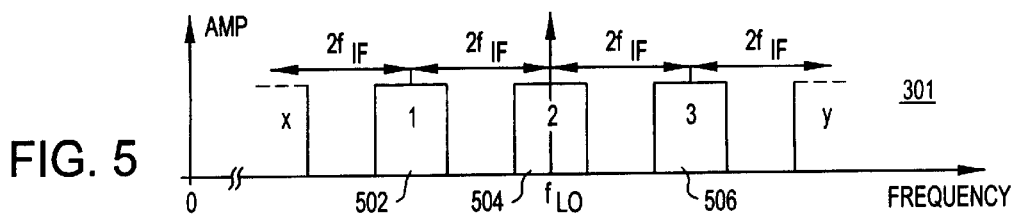
FIGS. 5 through 12 depict illustrations of a received signal as it is processed through select points in the example downconverter depicted in FIG. 3, in accordance with the teachings of the present invention.
Figure 6:
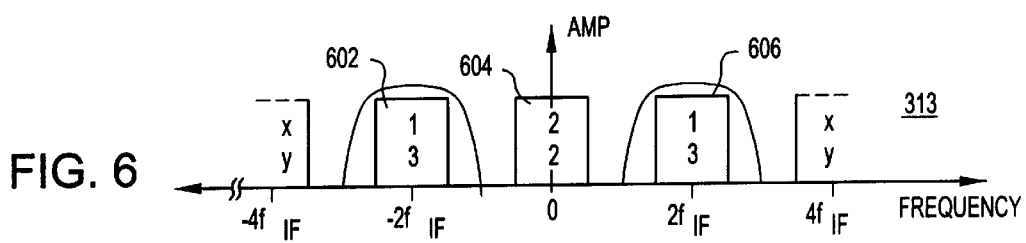

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention. Reference in the specification to "one embodiment" or "an embodiment" means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

Turning to FIG. 3, a block diagram of an example downconverter 300 incorporating the teachings of the present invention is depicted. In particular, as will be described in greater detail below, downconverter 300 is operative to improve the image rejection of a host receiver by employing spectrum manipulation. In one embodiment of the present invention, downconverter 300 is beneficially incorporated in receiver 100 as downconverter 106. As depicted in the illustrated example embodiment of FIG. 3, downconverter 300 is comprised of a mixing network 302, summing stage 304 and filter 306. In accordance with the teachings of the present invention, to be described more fully below, mixing network 302 employs two signal processing paths to generate a corresponding number of spectrally manipulated versions of the received signal that, when processed through summing stage 304, eliminates undesirable signals through destructive interference, yielding the intermediate frequency signal from which the baseband signal is subsequently recovered. Accordingly, as will be described below, downconverter 300 employing the innovative mixing network 302 in series with summing stage 304 is operative to remove undesirable image signals from a downconverted received signal without using the high precision high frequency multi-pole filters (image-rejection filters) or quadrature downconversion techniques commonly associated with the prior art. Further, it will be apparent from the description to follow that a downconverter incorporating the teachings of the present invention, e.g., downconverter 300, is not sensitive to phase mismatches between quadrature paths and not as sensitive to gain mismatches as the prior art. Consequently, the present invention is readily adaptable to current integration technologies.

In accordance with the illustrated example embodiment of FIG. 3, a signal received by downconverter 302 is processed down multiple processing paths to produce corresponding first and second mixed signals. In accordance with the teachings of the present invention, the first mixed signal is subtracted from the second mixed signal in summing stage 304 and filtered in filter 306 to yield the desired downconverted signal, absent image signals, from which the baseband signal is recovered in subsequent processing sections of the receiver. In one embodiment, mixing network 302 employs dual parallel signal processing paths 308 and 310, respectively. In accordance with the example embodiment of FIG. 3, first signal processing path 308 is shown comprising mixer 312, filter 314 and mixer 316, cooperatively coupled in series as depicted. Second signal processing path 310 is shown comprising mixer 318 and mixer 320, cooperatively coupled in series as depicted.

In addition, in accordance with the illustrated example embodiment, downconverter 300 includes fixed local oscillator (LO) 322 and variable local oscillator (LO) 324. In one embodiment, fixed LO 322 and variable LO 324 are resident within the downconverter section of the receiver, while in alternate embodiments the signal is generated by a remote fixed LO 322 and a remote variable LO 324 and supplied to downconverter 300. As depicted in FIG. 3, in accordance with one embodiment of the present invention, fixed LO 322 provides a fixed signal to mixer 316 of first signal processing path 308, and to mixer 318 of second signal processing path 310. Variable LO 324 provides a signal to mixer 312 of first signal processing path 308, and to mixer 320 of second signal processing path 310. As will be described more fully below, variable LO 324 is operative to translate the received signal to baseband, while fixed LO 322 is operative to shift the signal spectrum to the left and to the right by a frequency shift equivalent to the intermediate frequency ($f_{IF}$).

In one embodiment of the present invention, filter 314 is a bandpass filter. More specifically, in accordance with the teachings of the present invention, filter 314 is a bandpass filter centered at a frequency that is twice the intermediate frequency ($f_{IF}$) and has a bandwidth equal to the desired signal bandwidth. In addition, downconverter 300 includes filter 306. In one embodiment of the present invention, filter 306 is a low-pass filter with a roll-off frequency located at the intermediate frequency ($f_{IF}$). In an alternate embodiment of the present invention, filter 314 is a high pass filter with a cutoff frequency at $f_{IF}$. By increasing the frequency of fixed LO 322 by an integer multiple of the intermediate frequency (IF) will result in decreased phase and gain errors introduced by the highpass filter, while minimizing the group delay distortion of the upper path signals.

As will be developed more fully below, with reference to FIGS. 4 through 12, first signal processing path 308 manipulates the received signal to yield a first mixed signal comprising image signals at the desired IF, while second signal path 310 manipulates the received signal to render a second mixed signal comprising the undesirable image signals as well as the desired downconverted signal at the desired IF, wherein summing stage 304 subtracts the first mixed signal from the second mixed signal to render a resultant signal consisting of the desired downconverted signal, with harmonics. The harmonics are readily removed from the downconverted signal employing filter 306.

Given the foregoing description of example downconverter 300 incorporating the teachings of the present invention, in accordance with one embodiment of the present invention, the operation of downconverter 300 will be presented with reference to the method of FIG. 4, along with the graphical illustrations of FIGS. 5 through 12 depicting the frequency spectrum at select points throughout downconverter 300.

Turning to FIG. 4, a flow chart depicting one example method for downconverting a received signal to a desired intermediate frequency ($f_{IF}$) is presented. As depicted in FIG. 4, the method begins at step 402, wherein downconverter 300 receives signal $v_{in}(t)$ via line 102. As depicted in FIG. 5, the received spectrum viewed at point 301 of downconverter 300 may be represented without loss of generality as a summation of single tones, each representing a transmitted channel, wherein tones $A_1$ 502 and $A_3$ 506 represent image signals (e.g., $2f_{IF}$ from LO) on either side of the desired signal $A_2$ 504 to which the receiver is tuned:

$$v_{in}(t)=A_1 \cos(\omega_{LO}-2\omega_{IF})t+A_2 \cos(\omega_{LO})t+A_3 \cos(\omega_{LO}+2\omega_{IF})t \quad \text{(Eq. 1)}$$

In step 404, downconverter 300 passes the received signal to first signal processing path 308 and second signal processing path 310 of mixing network 302, wherein the signal is simultaneously processed along these parallel paths. With respect to first signal processing path 308 of mixing network 302, the received signal is mixed (e.g., multiplied) with a reference signal from variable LO 324 at mixer 312, step 406. In one embodiment, the reference signal of variable LO 324 is set to the desired carrier frequency ($f_{LO}$) corresponding to the desired signal ($A_2$), yielding a first intermediate mixed signal a(t). In accordance with the frequency spectrum of FIG. 6, the first intermediate mixed signal a(t) from mixer 312, viewed at point 313, may be described as:

$$a(t)=vin(t)\times\cos(\omega_{LO})t$$

$$a(t)=(A_1/2)\{\cos(2\omega_{IF})t+\cos(2\omega_{LO}-2\omega_{IF})t\}+(A_2/2)\{1+\cos(2\omega_{LO})t\}+(A_3/2)\{\cos(2\omega_{IF})t+\cos(2\omega_{LO}+2\omega_{IF})t\} \quad \text{(Eq. 2)}$$

Note that, as a result of mixing the received signal $v_{in}(t)$ with the reference signal from variable LO 324, each of the image signals $A_1$ and $A_3$ are now located at $\pm 2f_{IF}$, e.g., 602 and 606, respectively, while the desired signal $A_2$ has been translated to DC, e.g., 604.

Figure 7:
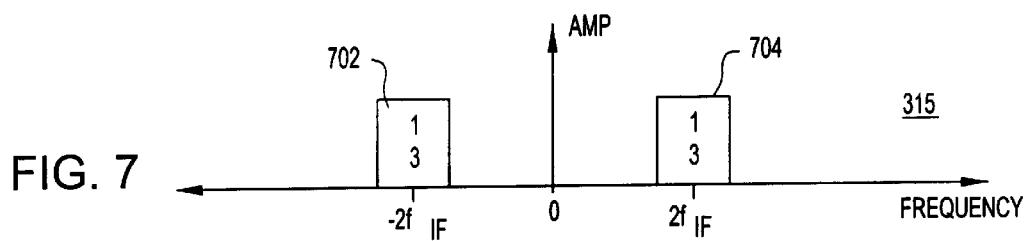

Having translated the entire spectrum to DC around the desired signal $A_2$, step 406, the first intermediate mixed signal a(t) is passed through filter 314, to produce a second intermediate signal â(t), step 408. As described above, in accordance with one embodiment of the present invention, filter 314 is a bandpass filter with a passband centered at two-times the intermediate frequency (e.g., centered at $2f_{IF}$). As depicted in FIG. 7, the second intermediate signal, viewed at point 315 of downconverter 300, is defined as:

$$â(t)=(A_1/2)\cos(2\omega_{IF})t+(A_3/2)\cos(2\omega_{IF})t \quad \text{(Eq. 3)}$$

Thus, the result of filtering the first intermediate mixed signal a(t) in step 408 is a second intermediate mixed signal â(t), defined as the subset of the first intermediate mixed signal a(t) located at $\pm 2f_{IF}$, while rejecting the rest of the spectrum. More specifically, the first intermediate mixed signal a(t) is filtered so that just the image signals ($A_1$ and $A_3$) remain at $\pm 2f_{IF}$, e.g., 702 and 704, respectively.

In step 410, the second intermediate mixed signal â(t) is mixed at mixer 316 with a reference frequency from fixed LO 322. In accordance with the illustrated example embodiment, mixer 316 mixes the second intermediate mixed signal â(t) with the output provided by fixed LO 322 centered at the intermediate frequency ($f_{IF}$), thus downconverting the filtered image signals ($A_1$ and $A_3$) comprising â(t) to the desired downconversion frequency ($f_{IF}$), denoted as the first mixed signal c(t). The resultant frequency spectrum of the first mixed signal, taken at point 317 is depicted in FIG. 8 and represented below in Equation 4:

$$c(t)=â(t)\times\cos(\omega_{IF})t$$

$$c(t)=(A_1/4)\{\cos(\omega_{IF})t+\cos(3\omega_{IF})t\}+(A_3/4)\{\cos(\omega_{IF})t+\cos(3\omega_{IF})t\} \quad \text{(Eq. 4)}$$

Figure 8:
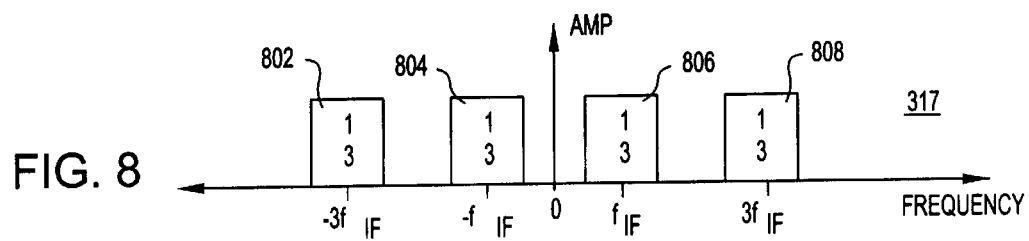
Figure 9:
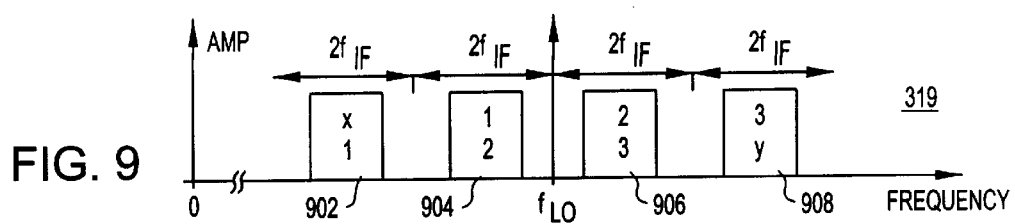
Figure 10:
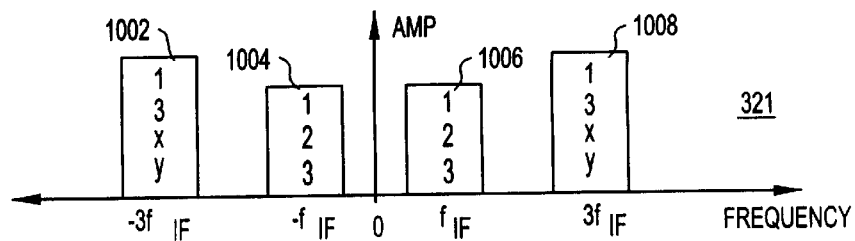

As depicted in FIG. 8 and Equation 4 above, the first mixed signal c(t) is comprised of the image signals ($A_1$ and $A_3$) downconverted to the desired IF (and multiples thereof, e.g., 3XIF), 802, 804, 806 and 808.

With continued reference to FIG. 4, the function of second signal processing path 310 will be described, beginning with step 412. In accordance with the illustrated example embodiment, the received signal $v_{in}(t)$ processed along second signal processing path 310 of downconverter 300 is mixed with a reference signal from fixed LO 322 at mixer 318 to produce a third intermediate signal b(t). As discussed above with reference to mixer 316, the reference signal from fixed LO 322 is centered around the desired downconversion frequency ($f_{IF}$). Consequently, the resulting third intermediate mixed signal b(t) is a downconverted representation of the received signal $v_{in}(t)$, including the adjacent channels being mixed midway between their original central frequencies. The resulting third intermediate mixed signal b(t) is depicted in the frequency spectrum of FIG. 9, and Equation 5, below:

$$b(t) = v_{in}(t) \times \cos(\omega_{IF})t \quad \text{(Eq. 5)}$$

$$b(t) = (A_1/2)\{\cos(\omega_{LO} - 3\omega_{IF})t + \cos(\omega_{LO} - \omega_{IF})t\} +$$
$$(A_2/2)\{\cos(\omega_{LO} - \omega_{IF})t + \cos(\omega_{LO} + \omega_{IF})t\} +$$
$$(A_3/2)\{\cos(\omega_{LO} + \omega_{IF})t + \cos(\omega_{LO} + 3\omega_{IF})t\}$$

Having downconverted the received signal $v_{in}(t)$ to the third intermediate signal b(t), step 412, the third intermediate signal b(t) is mixed with a reference signal from the variable LO 324 at mixer 320 to produce the second mixed signal d(t), step 414. In accordance with one embodiment of the present invention, as above, mixer 320 is designed to translate both the image signals ($A_1$ and $A_3$) as well as the desired signal ($A_2$) down to the desired (IF) frequency. The resultant signal from mixer 320, e.g., second mixed signal d(t), is graphically depicted in FIG. 10, and mathematically below in Equation 6:

$$d(t) = b(t) \times \cos(\omega_{LO})t \quad \text{(Eq. 6)}$$

$$d(t) = (A_1/4)\{\cos(3\omega_{IF})t + \cos(2\omega_{LO} - 3\omega_{IF})t +$$
$$\cos(\omega_{IF})t + \cos(2\omega_{LO} - \omega_{IF})t\} +$$
$$(A_2/4)\{\cos(\omega_{IF})t + \cos(2\omega_{LO} - \omega_{IF})t +$$
$$\cos(\omega_{IF})t + \cos(2\omega_{LO} + \omega_{IF})t\} +$$
$$(A_3/4)\{\cos(\omega_{IF})t + \cos(2\omega_{LO} + \omega_{IF})t +$$
$$\cos(3\omega_{IF})t + \cos(2\omega_{LO} + 3\omega_{IF})t\}$$

Figure 11:
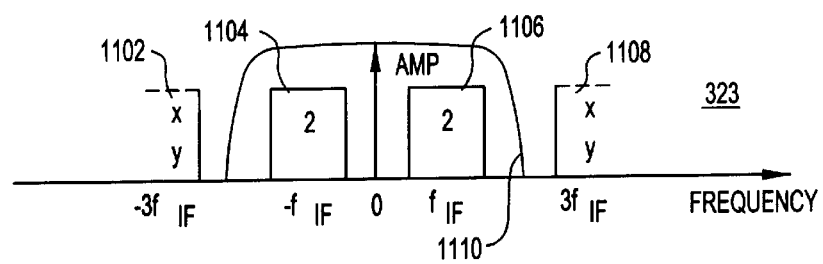
Figure 12:
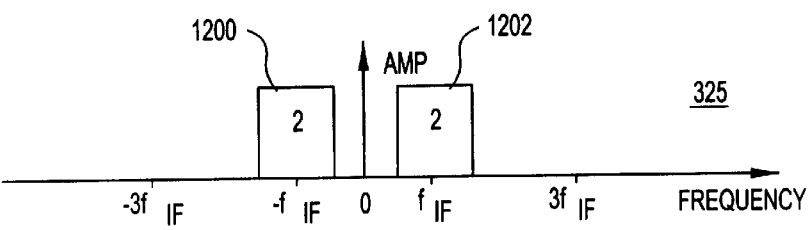

In accordance with the teachings of the present invention, the first mixed signal c(t) is subtracted from the second mixed signal d(t) in summing stage 304, step 416. In one embodiment, summing stage 304 inverts the first mixed signal c(t), summing the inverted first mixed signal (e.g., −c(t)) with the second mixed signal d(t) to produce the downconverted signal $v_{out}(t)$ including the desired signal ($A_2$) at intermediate frequency ($f_{IF}$), wherein the image signals ($A_1$ and $A_3$) which were lying on either side of the desired signal ($A_2$) are rejected. FIG. 11 depicts the frequency spectrum sampled at point 323 of downconverter 300 comprising $v_{out}(t)$ devoid of image signals. Mathematically, $v_{out}(t)$ is represented in Equation 7, below:

$$v_{out}(t) = d(t) - c(t) \quad \text{(Eq. 7)}$$

$$v_{out}(t) = (A_1/4)\{\cos(2\omega_{LO} - 3\omega_{IF})t + \cos(2\omega_{LO} - \omega_{IF})t\} +$$
$$(A_2/4)\{2\cos(\omega_{IF})t + \cos(2\omega_{LO} - \omega_{IF})t +$$
$$\cos(2\omega_{LO} + \omega_{IF})t\} +$$
$$(A_3/4)\{\cos(2\omega_{LO} + \omega_{IF})t + \cos(2\omega_{LO} + 3\omega_{IF})t\}$$

In accordance with Equation 7, and FIG. 11, neither of the image signals $A_1$ or $A_3$ are present at intermediate frequency ($f_{IF}$).

Having rejected the image signals through spectrum manipulation in steps 402–416, above, the desired signal $A_2$ is filtered from $v_{out}(t)$ with filter 306, step 418. In accordance with the illustrated example embodiment, filter 306 is a low pass filter with the roll-off frequency at the desired intermediate frequency ($f_{IF}$), thereby passing the desired downconverted signal $A_2$ while rejecting the remaining harmonic components in the spectrum. The result of step 418, $v'_{out}(t)$, sampled at the output of filter 306 is graphically illustrated in FIG. 12 and, mathematically, below in Equation 8:

$$v'_{out}(t) = (A_2/2)\cos(\omega_{IF})t \quad \text{(Eq. 8)}$$

Figure 14:
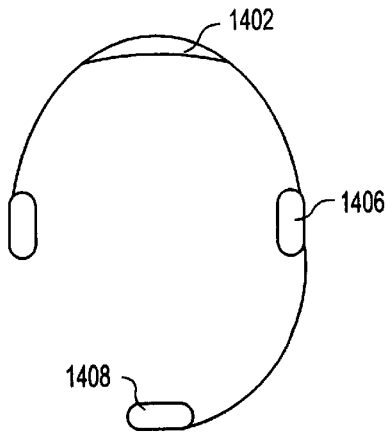
Figure 15:
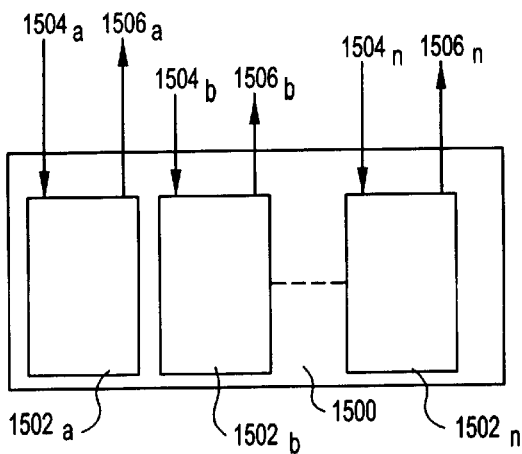

Given the foregoing description of one embodiment of the present invention, those skilled in the art will appreciate that downconverter 300 provides improved image rejection, while less sensitive to gain/phase mismatch than the prior art and is, thus, more amenable to current integration technologies. Consequently, a single-chip transceiver incorporating the teachings of the present invention is realizable given current IC fabrication technology, providing for smaller, lighter highly integrated communication devices. Examples of such devices incorporating the teachings of the present invention are depicted in FIGS. 13 through 15.

Figure 13:
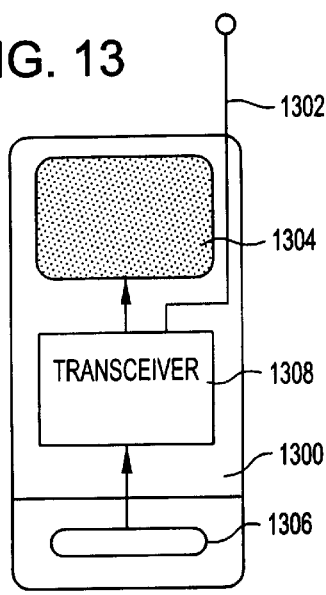
FIGS. 13, 14 and 15 each depict an example embodiment of a communication device incorporating the teachings of the present invention, in accordance with alternate embodiments of the present invention.

In one embodiment, for example, a wireless communication handset incorporating the teachings of the present invention is depicted in FIG. 13. As depicted therein, FIG. 13 illustrates wireless communication handset 1300 incorporating the teachings of the present invention. In accordance with one embodiment, wireless communication handset 1300 includes a single-chip transceiver incorporating the teachings of the present invention. As depicted, handset 1300 includes antenna 1302, speaker 1304, microphone 1306, and transceiver IC 1308 incorporating the teachings of the present invention. While antenna 1302, speaker 1304 and microphone 1306 all perform their typical functions known in the art, transceiver IC 1308 incorporates the teachings of downconverter 300 amenable to current integration technologies. Another embodiment of a wireless communication device is depicted in FIG. 14, wherein a wireless communication headset incorporating the teachings of the present invention is shown. In accordance with the illustrated example embodiment of FIG. 14, wireless communication headset 1400 is shown comprising headband with antenna 1404 and integrated transceiver IC 1402 incorporating the teachings of the present invention, one or two ear-piece speakers 1406 and microphone 1408.

In another embodiment, wireless communication base stations may also benefit from the teachings of the present invention by integrating a number of transceivers on a single board, thereby increasing the number of transceivers and, thus, communication channels supported by a single base station. One example of such a board is depicted in FIG. 15, wherein transceiver board 1500 is depicted with a plurality of transceiver ICs 1502a–1502n incorporating the teachings of the present invention. Those skilled in the art will appreciate that transceiver board 1500 is but one example of a number of alternative embodiments incorporating the teachings of the present invention. Thus, modifications and alterations are anticipated without deviating from the spirit and scope of the present invention.

Figure 16:
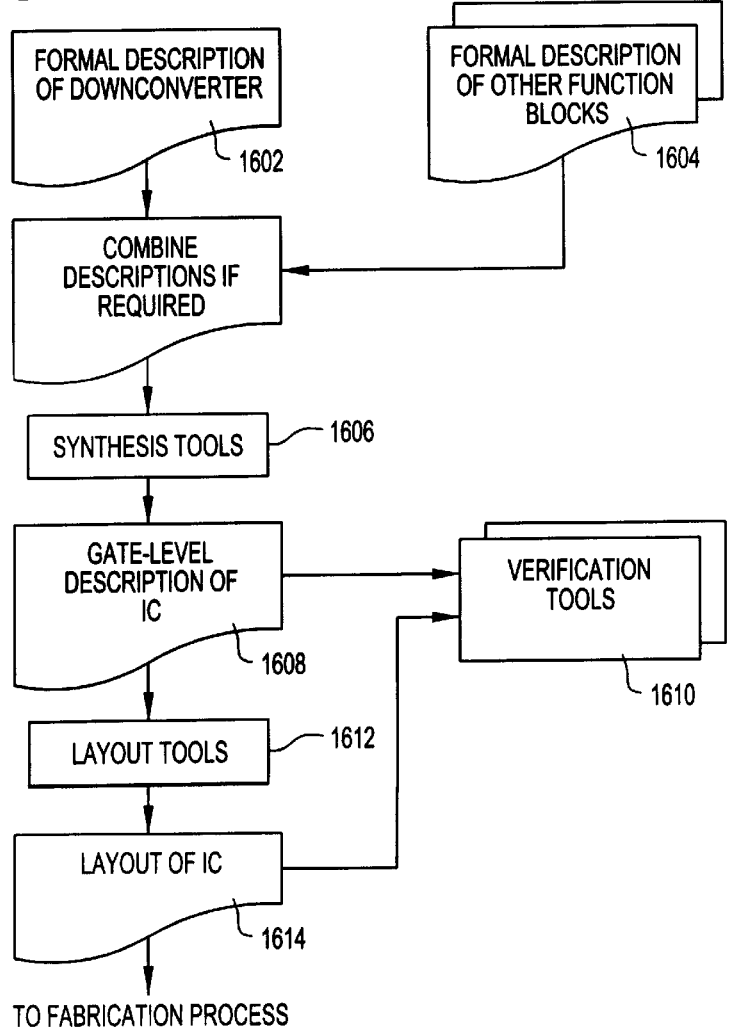
FIG. 16 illustrates a block diagram of a process for creating an integrated circuit (IC) incorporating the teachings of the present invention, in accordance with one embodiment of the present invention.

Turning now to FIG. 16 wherein a block diagram illustrating one embodiment of a design process for designing an IC incorporated with the innovative downconverter of the present invention is shown. As illustrated, a formal description 1602 of the downconverter is prepared. Formal description 1602 may be prepared in any one of the formal IC description languages known in the art, e.g., Very High Speed Integrated Circuit (VHSIC) Description Language, or VHDL, Verilog, and the like, using any one of a number of known design description editors supporting the desired formal description language.

Formal description 1602 is then optionally merged with formal descriptions 1604 of other function blocks of the IC, if the downconverter is to be fabricated as an integral part of a "larger" IC. Formal description 1602, or the merged formal descriptions 1602 and 1604, are then provided to synthesis tools 1606 to synthesize, i.e. to generate, a gate-level description 1608 of the IC to be fabricated. The gate-level description 1608 may then be used by a number of verification tools 1610, such as simulators or emulators, to verify the correctness of the design. An example of a verification tool is the SimExpress™ emulator product manufactured by Meta System of Saclay, France, a wholly owned subsidiary of the assignee of the present invention.

Upon verification, or in parallel, gate-level description 1608 of the IC is then provided to layout tools 1612 to generate physical layout description 1614 of the IC. Layout description 1614 is also subjected to verification by layout level ones of verification tools 1610. An example of layout level verification is parasitic analysis for submicron level integration. Upon verification, layout description 1614 of the IC is then provided to the fabrication process to fabricate the desired IC.

Those skilled in the art will appreciate that the design process and the fabrication process may be performed by different parties. In fact, the creation of formal description 1602 may be performed by a party independent of the party or parties who prepare formal descriptions 1604 for the other function blocks, and/or the party or parties who perform the synthesis, verifications, etc. Formal description 1602 may be provided to these other parties via any one of a number of known data transfer methods, e.g. through removable storage medium such as magnetic tape, compact disk (CD), digital versatile disk (DVD), and the like, or through networked data communication links. In this context, formal description 1602 is often referred to as a "soft core".

Figure 17:
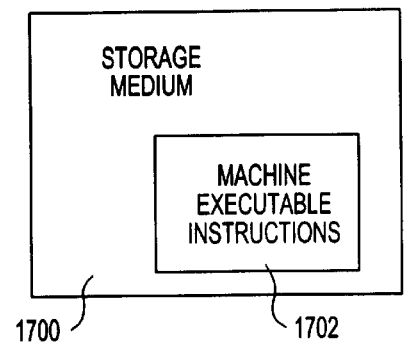
FIG. 17 illustrates a block diagram representation of a storage medium having stored thereon a plurality of machine executable instructions for implementing the teachings of the present invention, in accordance with one embodiment of the present invention.

While the foregoing description has described the present invention in terms of an IC implementation, those skilled in the art will also appreciate that the present invention may be practiced in a software embodiment, implemented in any one of a number of programming languages known in the art, e.g. the C++ programming language. FIG. 17 illustrates an exemplary storage medium 1700 having stored thereon machine executable instructions 1702 of one such software embodiment. As depicted, storage medium 1700 is intended to represent a broad range of storage media and memory devices including but not limited to the media enumerated above. The machine readable instructions of the illustrated software embodiment, when processed by a suitable processor, implements the downconverter function incorporating the teachings of the present invention as described.

Figure 18:
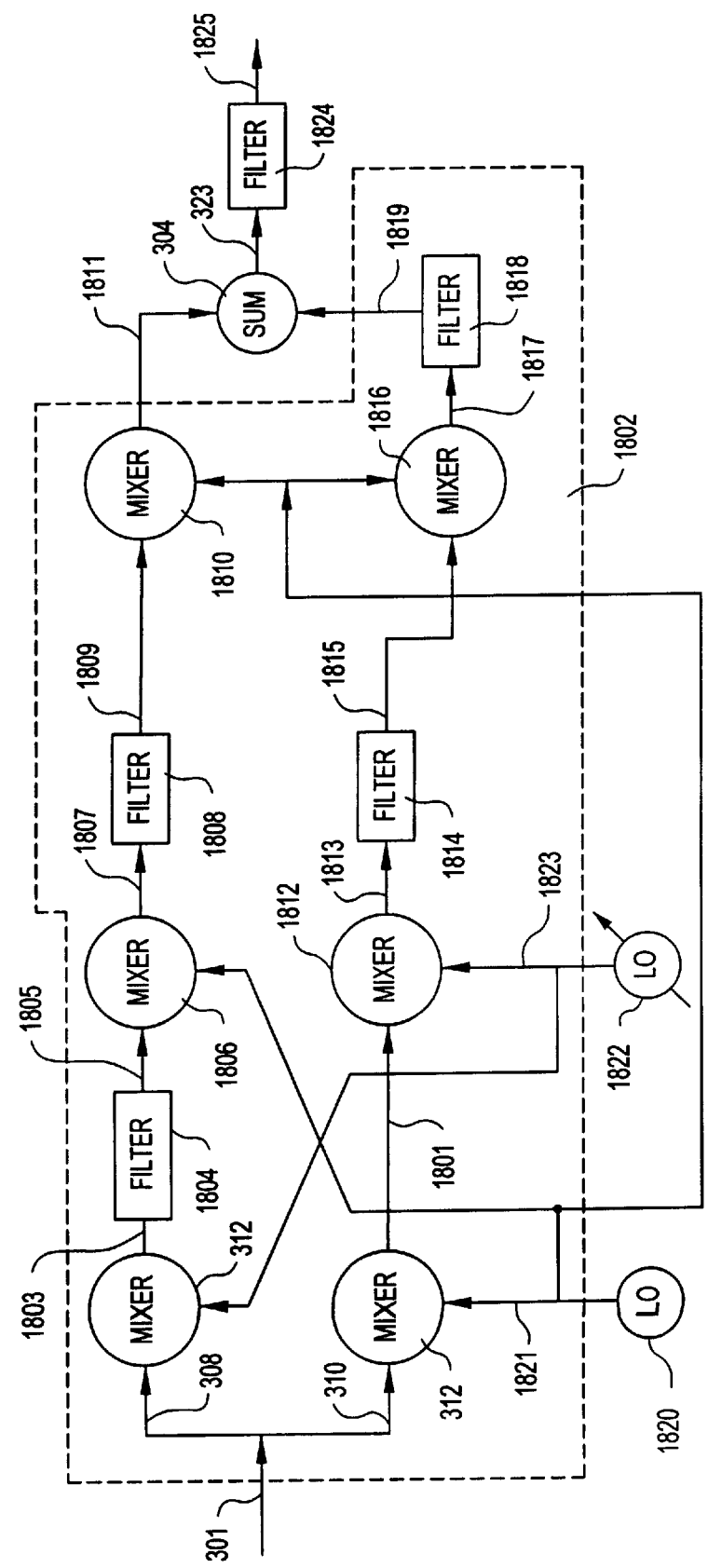
FIG. 18 illustrates a block diagram of an example downconverter incorporating the teachings of the present invention, in accordance with an alternate embodiment of the present invention.
Figure 19:
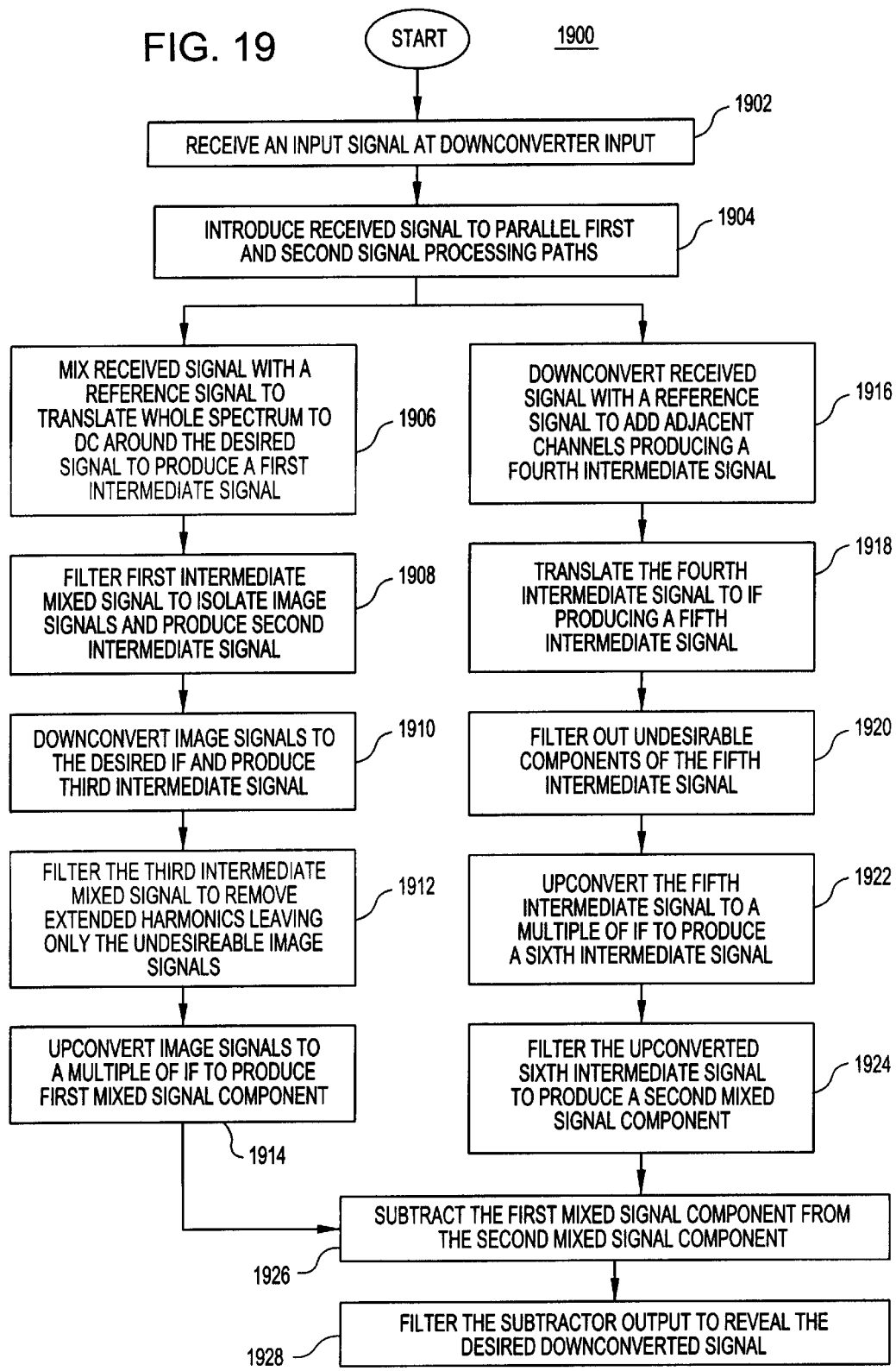
FIG. 19 illustrates a flow chart of an example method for downconverting a received signal in accordance with the teachings of the alternate embodiment presented in FIG. 18.
Figure 20:
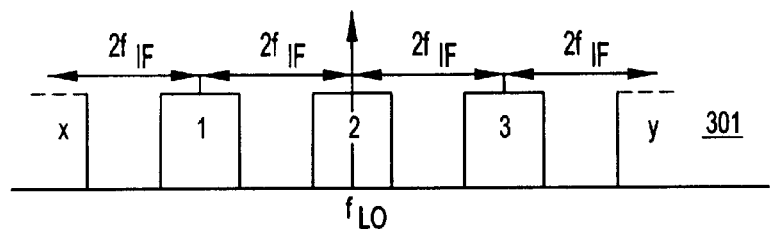
FIGS. 20 through 31 depict illustrations of a received signal as it is processed through select points in the example downconverter depicted in FIG. 18, in accordance with the teachings of the present invention.

Having introduced the concept of the present invention above, with respect to FIGS. 3–17, an alternate embodiment of the present invention will now be developed with reference to the block diagram of FIG. 18, the method of FIG. 19 and the frequency plans depicted in FIGS. 20 through 31. Those skilled in the art will appreciate, from the description to follow, that while the alternate embodiment illustrated in FIG. 18 represents a slightly more complex solution, it offers the advantage of improved image rejection by further reducing the group delay distortion commonly associated with use of band-pass filters.

Turning to FIG. 18, a block diagram of an example downconverter 1800 is presented incorporating the teachings of the present invention, in acccordance with an alternate embodiment of the present invention. As with downconverter 300, above, downconverter 1800 also employs a dual path mixing network 1802, summing stage 304 and filter 1825. As with downconverter 300, signals received by downconverter 1800 are processed down the multiple processing paths of a mixing network to produce a first and a second mixed signal, wherein the first mixed signal is subtracted from the second mixed signal and filtered to yield the desired downconverted signal, absent the undesirable image signals. However, those skilled in the art will appreciate that dual path mixing network 1802 is slightly more complex than the mixing network found in downconverter 300, which provides for improved image rejection with very low intermediate frequency (IF) equal to the channel spacing.

In accordance with one embodiment of the present invention, the upper processing path of dual path mixing network 1802 is shown comprising mixer 312, filter 1804, mixer 1806, filter 1808 and mixer 1810, each communicatively coupled as shown. The lower path of dual path mixing network 1802 is shown comprising mixer 318, mixer 1812, filter 1814, mixer 1816 and filter 1818, each communicatively coupled as shown. In addition, downconverter 1800 further comprises fixed local oscillator 1820 and variable local oscillator 1822, coupled to dual path mixing network 1802, as shown. As shown, fixed LO 1820 provides a signal to mixers 318, 1806, 1810 and 1816, while variable LO 1822 provides a signal to mixers 312 and 1812. As will be described more fully below, variable LO is operative to translate the received signal to baseband while fixed LO is operative to shift the signal spectrum by a frequency equivalent to the intermediate frequency ($f_{IF}$).

In accordance with one embodiment of the present invention, filters 1804 and 1818 are high pass filters with a lower cutoff frequency located at the intermediate frequency $f_{IF}$. In an alternate embodiment, filters 1808 and 1814 are band pass filters with a center frequency located at twice the intermediate frequency, e.g., $2f_{IF}$. Similarly, in one embodiment, filter 1824 is a band pass filter with a central frequency located at twice the intermediate frequency, e.g., at $2f_{IF}$. Those skilled in the art will appreciate, from the description to follow, that the dual path mixing network 1802 of the present invention provides for balanced gain and group delay distortion among the upper and lower paths of the mixing network, thereby providing for improved image rejection than that of prior art solutions.

Having introduced the architectural elements distinguishing the balanced dual path mixing network 1802 from that of the dual path mixing network 300, the operation of balanced dual path mixing network 1802 will be developed with reference to the flow chart depicted in FIG. 19 and the frequency plan depicted in FIGS. 20–31. For ease of explanation, and not limitation, the method of FIG. 19 will be developed with reference to downconverter 1800 introduced in FIG. 18, in accordance with an alternate embodiment of the present invention.

Figure 21:
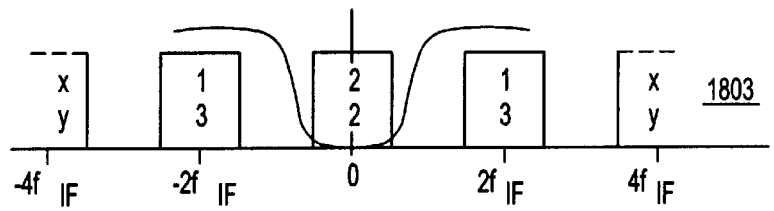
Figure 22:
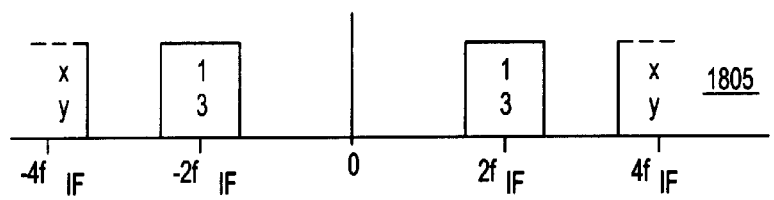

Turning to FIG. 19, an example method for downconverting a received signal in accordance with the teachings of the present invention is presented. In accordance with the illustrated example embodiment, method 1900 begins when downconverter 1800 receives a signal 301, block 1902. The received signal 301 (e.g., FIG. 20) is introduced to the parallel first 308 and second 310 signal processing paths of balanced mixing network 1802, block 1904. Following the received signal down the first signal processing path, the received signal 301 is mixed by mixer 312 with a reference signal produced by variable LO 1822 to translate the entire received spectrum to DC around the desired signal to produce a first intermediate signal 1803 (e.g., FIG. 21), block 1906. The first intermediate signal 1803 is subsequently passed through 1804, to provide second intermediate signal 1805 (e.g., FIG. 22), block 1908. In accordance with one embodiment of the present invention, as described above, filter 1804 is a high pass filter with a cutoff frequency of $f_{IF}$, as depicted in FIG. 21.

Figure 23:
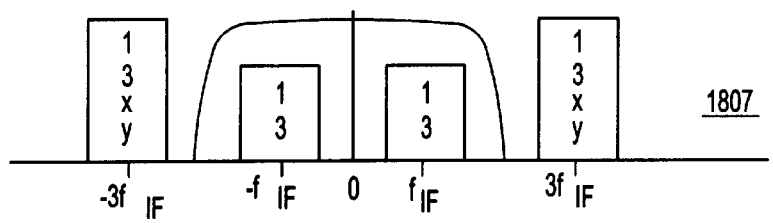
Figure 24:
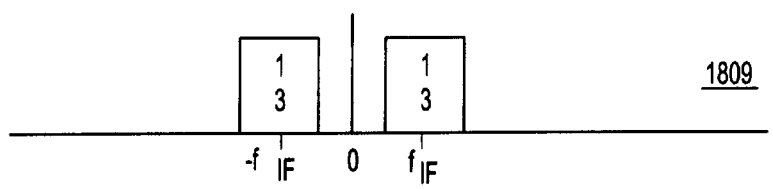
Figure 25:
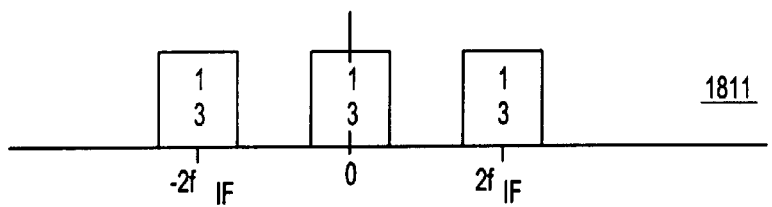
Figure 26:
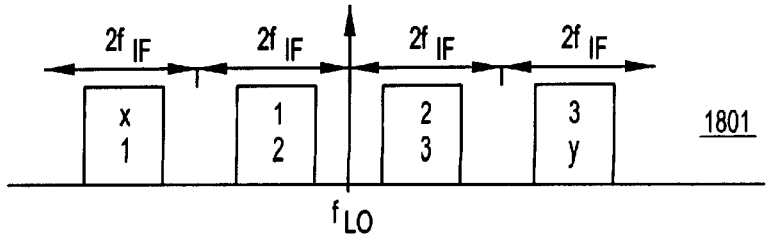
Figure 27:
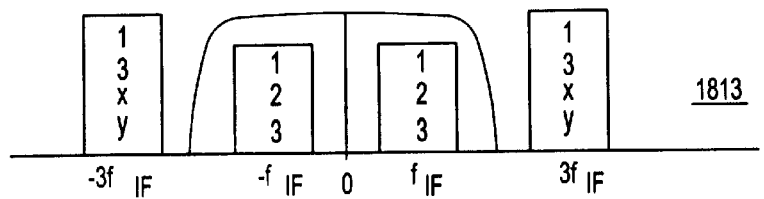
Figure 28:
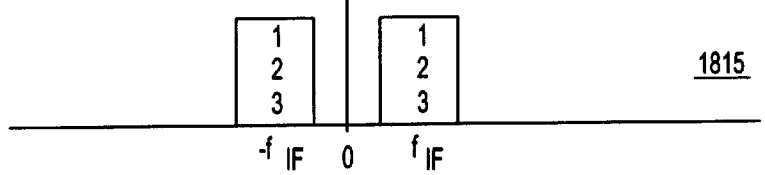
Figure 29:
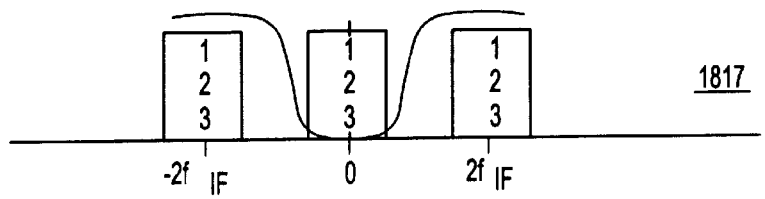
Figure 30:
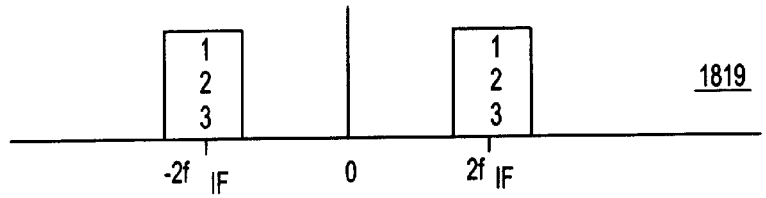
Figure 31:
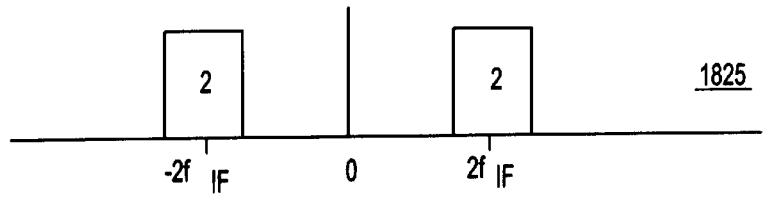

Continuing along the first parallel processing path, the second intermediate signal 1805 is downconverted in mixer 1806 with a signal provide by fixed LO 1820 to produce a third intermediate signal 1807 (e.g., FIG. 23), block 1910. At 1912, the third intermediate signal 1807 is filtered by filter 1808 to remove extended harmonics leaving only the undesireable image signals of the third intermediate signal 1809 (e.g., FIG. 24). In accordance with one embodiment of the present invention, as described above, filter 1808 is a low pass filter with a cutoff frequency of $f_{IF}$, as depicted in FIG. 23. At block 1914, the third intermediate signal 1809 is upconverted in mixer 1810 with a reference signal provided by fixed LO 1820 to a multiple of $f_{IF}$ to produce the first mixed signal component 1811 (e.g., FIG. 25). In the illustrated example embodiment, for example, the third intermediate signal 1809 is upconverted to twice $f_{IF}$ to produce the first mixed signal component 1811.

Turning next to the second parallel signal processing path, the received signal 301 is mixed in mixer 312 to $f_{IF}$ with a reference signal provided by fixed LO 1820 to produce a fourth intermediate signal 1801 in which adjacent channels are added (e.g., FIG. 26), block 1916. The fourth intermediate signal 1801 is translated to DC in mixer 1812 with a reference signal provided by variable LO 1822 to produce a fifth intermediate signal 1813 (e.g., FIG. 27), block 1918. At 1920, undesirable components of the fifth intermediate signal 1813 are filtered out by filter 1814 to leave signal 1815 of FIG. 28. In accordance with one embodiment of the present invention, filter 1814 is a low pass filter with a cutoff frequency of $f_{IF}$. The filtered fifth intermediate signal 1815 is then upconverted to a multiple of $f_{IF}$ (e.g., twice $f_{IF}$), block 1922, by mixing the fifth intermediate signal 1815 with a reference signal provided by fixed LO 1820 in mixer 1816 to produce an upconverted fifth intermediate signal 1817 (e.g., FIG. 29). The upconverted fifth intermediate signal 1817 is subsequently filtered with filter 1818 to compensate for any gain and phase distortion added by filter 1804 and produce a second mixed signal component 1819 (e.g., FIG. 30), block 1924. In accordance with one embodiment of the present invention, filter 1818 is a high pass filter with a cutoff frequency of $f_{IF}$.

Having produced the first mixed signal component 1811 containing the undesirable image signals centered at a multiple of $f_{IF}$ in the first parallel signal processing path, and the second mixed signal component 1819 containing the desired downconverted signal as well as the undesirable image signals centered at a multiple of $f_{IF}$ in the second parallel signal processing path, the first and second mixed signal components 1811 and 1819 are summed in summing node 304 to remove the undesirable image signals from the second mixed signal component, block 1926. The subtractor output 323 from summing node 304 is provided to filter 1824 to remove any lingering extended harmonics to produce the desired signal 1825 (e.g., FIG. 31). In accordance with one embodiment of the present invention, filter 1824 is a band pass filter with central frequency at twice $f_{IF}$ to remove any extended harmonics greater than the IF multiple.

Those skilled in the art will appreciate that the teachings of the present invention facilitate the integration of a receiver on a single chip. One problem associated with integrating a receiver on a single chip is the high IF frequency imposed by the level of image rejection required. Thus, it is necessary to lower the IF frequency while still being immune of image interference. Prior art techniques require quadrature mixing where the incoming signal is split into two parallel paths and mixed with quadrature outputs of local oscillator. However, since the frequency of the local oscillator is variable (to choose desired signal), the quadrature outputs have to be in perfect gain (amplitude) and quadrature phase matching over the tuning range of the LO. Those skilled in the art will appreciate that this is extraordinarily difficult due to the inherent deficiencies in circuit architectures as well as fabrication and process variations. In contrast, the innovation represented by the present invention provides for image rejection without resorting to quadrature mixing and is, thus more immune to any architectural mismatch problems or process variations.

Thus, a method and apparatus for rejecting image in a receiver has been described. Those skilled in the art will appreciate that the method and architecture of the present invention is completely insensitive to phase mismatch, since no quadrature mixing is employed, and not as sensitive to gain mismatch as the prior art downconverters described above and, thus, is readily adaptable to current integration technologies. While the method and apparatus of the present invention has been described in terms of the above illustrated example embodiments, those skilled in the art will recognize that the invention is not limited to the example embodiments described. For example, although in one embodiment of the present invention the downconverter has been described as including two (2) signal processing paths generating two spectrally manipulated versions of the received signal, those skilled in the art will appreciate that a number of processing paths may be employed generating a corresponding number of spectrally manipulated signals from which the desired signal is provided devoid of unwanted image signals. Thus, the present invention can be practiced with modification and alteration without deviating from the spirit and scope of the appended claims. Thus, the description is to be regarded as illustrative instead of restrictive on the present invention.

What is claimed is:

1. An apparatus comprising:
   a mixing network, to receive a signal and process the received signal along a first branch of the mixing network to produce a first mixed signal containing an image signal, and along a second branch of the mixing network to produce a second mixed signal containing the image signal and a desired signal, wherein the processing along the first and second branches of the mixing network involves downconversion and upconversion of the received signal by providing the received signal and reference signals to the first and second branches of the mixing network devoid of phase shifting; and
   a summing stage, coupled to the first branch of the mixing network and the second branch of the mixing network, to subtract the first mixed signal from the second mixed signal to produce a downconverted signal devoid of the image signal.

2. The apparatus of claim 1, further comprising:
a filter, coupled to the summing stage, operative to pass a subset of the downconverted signal falling within a passband of the filter, while rejecting a subset of the downconverted signal falling outside of the passband.

3. The apparatus of claim 1, wherein the apparatus is fabricated on a single integrated circuit as part of a single-chip transceiver.

4. The apparatus of claim 1, wherein the first branch of the mixing network comprises:
a first mixer, to mix the received signal with a first reference signal from a variable local oscillator to produce a first intermediate signal;
a filter, coupled to the first mixer, to pass a subset of the first intermediate signal falling within a passband of the filter, and reject a remaining portion of the first intermediate signal falling outside of the passband of the filter, wherein the subset of the first intermediate signal falling within the passband includes the undesirable image signal;
a second mixer, coupled to the filter, to mix the image signal with a second reference signal comprising a fixed intermediate frequency (IF) signal centered at an intermediate frequency ($f_{IF}$) and to mix the image signal down to a desired downconversion frequency to yield a second intermediate signal;
a second filter, coupled to the second mixer, to remove undesirable harmonics from the second intermediate signal; and
a third mixer, coupled to the second filter, to upconvert the third intermediate signal to a multiple of the intermediate frequency ($f_{IF}$) to produce the first mixed signal.

5. The apparatus of claim 4, wherein the second branch of the mixing stage comprises:
a fourth mixer, to mix the received signal with the fixed intermediate frequency (IF) signal centered at the intermediate frequency ($f_{IF}$) to add both the desired signal and the image signals together producing a third intermediate signal;
a fifth mixer, coupled to the fourth mixer, to translate the third intermediate signal to the intermediate frequency $f_{IF}$ producing a fourth intermediate signal;
a third filter, coupled to the fifth mixer, to remove undesirable harmonics from the fourth intermediate signal to produce a fifth intermediate signal;
a sixth mixer, coupled to the third filter, to upconvert the fifth intermediate signal to a multiple of the intermediate frequency $f_{IF}$ producing a sixth intermediate signal; and
a fourth filter, coupled to the sixth mixer, to remove undesirable harmonics from the sixth intermediate signal to yield the second mixed signal.

6. The apparatus of claim 5, wherein the first mixed signal is comprised of the image signal centered at the multiple of the intermediate frequency ($f_{IF}$), while the second mixed signal is comprised of the image signal and the desired signal centered at the multiple of the intermediate frequency ($f_{IF}$), wherein subtracting the first mixed signal from the second mixed signal yields the desired signal centered at the intermediate frequency ($f_{IF}$).

7. The apparatus of claim 6, further comprising:
an output filter, coupled to the summing stage, operative to pass a subset of the downconverted signal containing the desired signal centered at the intermediate frequency ($f_{IF}$) falling within a passband, while rejecting a subset of the received signal falling outside of the passband.

8. The apparatus of claim 1, wherein the second branch of the mixing stage comprises:
a first mixer, to mix the received signal with a fixed intermediate frequency (IF) signal centered at the intermediate frequency ($f_{IF}$) to sum the desired signal and the image signals together producing a first intermediate signal;
a second mixer, coupled to the first mixer, to translate the first intermediate signal to the intermediate frequency $f_{IF}$ producing a second intermediate signal;
a first filter, coupled to the second mixer, to remove undesirable harmonics from the second intermediate signal to produce a third intermediate signal;
a third mixer, coupled to the first filter, to upconvert the third intermediate signal to a multiple of the intermediate frequency $f_{IF}$ producing a fourth intermediate signal; and
a second filter, coupled to the third mixer, to remove undesirable harmonics from the fourth intermediate signal to yield the second mixed signal.

9. The apparatus of claim 8, wherein the second mixed signal comprises the desired signal and the image signal centered at the multiple of the intermediate frequency ($f_{IF}$).

10. An integrated circuit comprising:
a mixing network, to receive a signal and process the received signal along a first branch of the mixing network to produce a first mixed signal containing an image signal, and along a second branch of the mixing network to produce a second mixed signal containing the image signal and a desired signal, wherein the processing along the first and second branches of the mixing network involves downconversion and upconversion of the received signal by providing the received signal and reference signals to the first and second branches of the mixing network devoid of phase shifting; and
a summing stage, coupled to the first branch of the mixing network and the second branch of the mixing network, to subtract the first mixed signal from the second mixed signal to produce a downconverted signal devoid of the image signal.

11. The integrated circuit of claim 10, further comprising:
a filter, coupled to the summing stage, to pass a subset of the downconverted signal falling within a passband of the filter, while rejecting a subset of the downconverted signal falling outside the passband.

12. The integrated circuit of claim 10, wherein the first branch of the mixing network comprises:
a first mixer, to mix the received signal with a first reference signal from a variable local oscillator to produce a first intermediate signal;
a filter, coupled to the first mixer, to pass a subset of the first intermediate signal falling within a passband of the filter, and reject a remaining portion of the first intermediate signal falling outside of the passband of the filter, wherein the subset of the first intermediate signal falling within the passband includes the undesirable image signal;
a second mixer, coupled to the filter, to mix the image signal with a second reference signal comprising a fixed intermediate frequency (IF) signal centered at an intermediate frequency ($f_{IF}$) and to mix the image signal down to a desired downconversion frequency to yield a second intermediate signal;

a second filter, coupled to the second mixer, to remove undesirable harmonics from the second intermediate signal; and a third mixer, coupled to the second filter, to upconvert the third intermediate signal to a multiple of the intermediate frequency ($f_{IF}$) to produce the first mixed signal.

13. The integrated circuit of claim 12, wherein the second branch of the mixing stage comprises:

a fourth mixer, to mix the received signal with the fixed intermediate frequency (IF) signal centered at the intermediate frequency ($f_{IF}$) to add both the desired signal and the image signals together producing a third intermediate signal;

a fifth mixer, coupled to the fourth mixer, to translate the third intermediate signal to the intermediate frequency $f_{IF}$ producing a fourth intermediate signal;

a third filter, coupled to the fifth mixer, to remove undesirable harmonics from the fourth intermediate signal to produce a fifth intermediate signal;

a sixth mixer, coupled to the third filter, to upconvert the fifth intermediate signal to a a multiple of the intermediate frequency $f_{IF}$ producing a sixth intermediate signal; and a fourth filter, coupled to the sixth mixer, to remove undesirable harmonics from the sixth intermediate signal to yield the second mixed signal.

14. The integrated circuit of claim 13, wherein the first mixed signal is comprised of the image signal centered at the multiple of the intermediate frequency ($f_{IF}$), while the second mixed signal is comprised of the image signal and the desired signal centered at the multiple of the intermediate frequency ($f_{IF}$), wherein subtracting the first mixed signal from the second mixed signal yields the desired signal centered at the multiple of the intermediate frequency ($f_{IF}$).

15. The integrated circuit of claim 14, further comprising:

an output filter, coupled to the summing stage, to pass a subset of the downconverted signal centered at the multiple of the intermediate frequency ($f_{IF}$) falling within a passband of the filter, while rejecting a subset of the downconverted signal falling outside of the passband of the filter.

16. A transceiver comprising:

a transmitter, to transmit a transmit signal; and a receiver, to receive a signal having embedded therein a desired signal, the receiver including a balanced downconverter to extract the desired signal from the received signal, the downconverter comprising:

a mixing network, to receive a signal and process the received signal along a first branch of the mixing network to produce a first mixed signal containing an image signal, and along a second branch of the mixing network to produce a second mixed signal containing the image signal and a desired signal, wherein the processing along the first and second branches of the mixing network involves downconversion and upconversion of the received signal by providing the received signal and reference signals to the first and second branches of the mixing network devoid of phase shifting; and a summing stage, coupled to the first branch of the mixing network and the second branch of the mixing network, to subtract the first mixed signal from the second mixed signal to produce a downconverted signal devoid of the image signal.

17. The transceiver of claim 16, wherein the first branch of the mixing network comprises:

a first mixer, to mix the received signal with a first reference signal from a variable local oscillator to produce a first intermediate signal;

a filter, coupled to the first mixer, to pass a subset of the first intermediate signal falling within a passband of the filter, and reject a remaining portion of the first intermediate signal falling outside of the passband of the filter, wherein the subset of the first intermediate signal falling within the passband includes the undesirable image signal;

a second mixer, coupled to the filter, to mix the image signal with a second reference signal comprising a fixed intermediate frequency (IF) signal centered at an intermediate frequency ($f_{IF}$) and to mix the image signal down to a desired downconversion frequency to yield a second intermediate signal;

a second filter, coupled to the second mixer, to remove undesirable harmonics from the second intermediate signal; and a third mixer, coupled to the second filter, to upconvert the third intermediate signal to a multiple of the intermediate frequency ($f_{IF}$) to produce the first mixed signal.

18. The transceiver of claim 17, wherein the second branch of the mixing stage comprises:

a fourth mixer, to mix the received signal with the fixed intermediate frequency (IF) signal centered at the intermediate frequency ($f_{IF}$) to add both the desired signal and the image signals together producing a third intermediate signal;

a fifth mixer, coupled to the fourth mixer, to translate the third intermediate signal to the intermediate frequency $f_{IF}$ producing a fourth intermediate signal;

a third filter, coupled to the fifth mixer, to remove undesirable harmonics from the fourth intermediate signal to produce a fifth intermediate signal;

a sixth mixer, coupled to the third filter, to upconvert the fifth intermediate signal to a multiple of the intermediate frequency $f_{IF}$ producing a sixth intermediate signal; and a fourth filter, coupled to the sixth mixer, to remove undesirable harmonics from the sixth intermediate signal to yield the second mixed signal.

19. The transceiver of claim 18, wherein the first mixed signal is comprised of the image signal centered at the multiple of the intermediate frequency ($f_{IF}$), while the second mixed signal is comprised of the image signal and the desired signal centered at the multiple of the intermediate frequency ($f_{IF}$), wherein subtracting the first mixed signal from the second mixed signal yields the desired signal centered at the multiple of the intermediate frequency ($f_{IF}$).

20. The transceiver of claim 19, further comprising:

an output filter, coupled to the summing stage, to pass a subset of the downconverted signal containing the desired signal centered at the multiple of the intermediate frequency ($f_{IF}$) falling within a passband of the filter, while rejecting a subset of the downconverted signal centered at the multiple of the intermediate frequency ($f_{IF}$) falling outside of the passband of the filter.

21. A method for downconverting a received signal containing a desired signal to a multiple of an intermediate frequency ($f_{IF}$) devoid of image signals, the method comprising:

(a) routing the received signal down at least a first processing path and a second processing path;

(b) processing the received signal down the first processing path, wherein the received signal is first downconverted then upconverted to produce a first mixed signal containing the image signal;

(c) processing the received signal down the second processing path wherein the received signal is downconverted and subsequently upconverted to produce a second mixed signal containing the image signal and the desired signal, wherein processing the received signal down the first and second processing paths includes providing the received signal and reference signals to the first and second processing paths devoid of phase shifting; and (d) subtracting the second mixed signal from the first mixed signal to yield the desired signal at the multiple of the intermediate frequency ($f_{IF}$) while rejecting the image signal.

22. The method of claim 21, wherein processing the received signal down the first processing path (b) comprises:

(b.1) mixing the received signal with a first reference signal from a variable oscillator to produce a first intermediate signal;

(b.2) filtering the first intermediate signal to pass a subset of the first intermediate signal falling within a passband of the filter, while rejecting a subset of the first intermediate signal falling outside the passband of the filter;

(b.3) mixing the filtered first intermediate signal with a second reference signal comprising a fixed intermediate frequency (IF) signal centered at the intermediate frequency ($f_{IF}$) to downconvert the filtered first intermediate signal down to the intermediate frequency ($f_{IF}$) and to produce a second intermediate signal;

(b.4) filtering the second intermediate signal remove extended harmonics from the second intermediate signal; and (b.5) upconverting the filtered second intermediate signal to a multiple of the intermediate frequency ($f_{IF}$) to produce the first mixed signal.

23. The method of claim 22, wherein processing the received signal down the second processing path (c) comprises:

(c.1) mixing the received signal with the fixed intermediate frequency (IF) signal centered at the intermediate frequency ($f_{IF}$) to sum the desired and the image signals together to produce a third intermediate signal;

(c.2) mixing both the third intermediate signal with the first reference signal to downconvert the third intermediate signal to the intermediate frequency ($f_{IF}$) to produce a fourth intermediate signal;

(c.3) filtering the fourth intermediate signal to remove undesirable harmonics;

(c.4) mixing the filtered fourth intermediate signal with the first reference signal to upconvert the fourth intermediate signal to a multiple of the intermediate frequency ($f_{IF}$) to produce a fifth intermediate signal; and (c.5) filtering the fifth intermediate signal to remove extended harmonics from the fifth intermediate signal yielding the second mixed signal.

24. The method of claim 22, further comprising:

(e) filtering the downconverted signal to pass a subset of the downconverted signal falling within a passband of the filter, while rejecting a subset of the downconverted signal falling outside of the passband of the filter.

* * * * *